United States Patent [19]

Camiade et al.

[11] Patent Number: 4,868,526

[45] Date of Patent: Sep. 19, 1989

[54] FREQUENCY-DOUBLING OSCILLATOR, TUNED BY VARACTORS

[75] Inventors: Marc Camiade, Bagneux; Alain Bert, Gif sur Yvette; Pierre Savary, Paris, all of France

[73] Assignee: Thomson Hybrides et Microondes, Paris, France

[21] Appl. No.: 285,630

[22] Filed: Dec. 16, 1988

[30] Foreign Application Priority Data

Dec. 18, 1987 [FR] France .............................. 87 17709

[51] Int. Cl.⁴ .............................................. H03B 5/12
[52] U.S. Cl. ........................... 331/117 FE; 331/177 V
[58] Field of Search .......... 331/36 C, 117 R, 117 FE, 331/117 D, 117 V

[56] References Cited

U.S. PATENT DOCUMENTS 4,670,722 6/1987 Rauscher ...................... 331/117 FE

FOREIGN PATENT DOCUMENTS 0203663 12/1986 European Pat. Off. .
0242292 10/1987 European Pat. Off. .
1906943 11/1969 Fed. Rep. of Germany .
2384382 10/1978 France .

OTHER PUBLICATIONS

Scott, B. N. et al.; "Octave Band Varactor-Tuned GaAs FET Oscillators"; 1981 *IEEE International Solid-State Circuits Conference*, pp. 138—139.

Primary Examiner—David Mis
Attorney, Agent, or Firm—Oblon, Spivak, McClelland, Maier & Neustadt

[57] ABSTRACT

An ultrahigh-frequency oscillator. To double the frequency of an oscillator having a single field-effect transistor (10), whose fundamental frequency is adjusted by an impedance of gate (13) and an impedance of source (15), a filter (16+17) is mounted between the drain of transistor (10) and the ground. This filter, formed by a self-induction coil (16) in series with a varactor (17) is adjusted to the fundamental frequency: it assures the rejection, and favors the generation of the second harmonic, at double frequency. Application to ultrahigh-frequency sources.

4 Claims, 1 Drawing Sheet

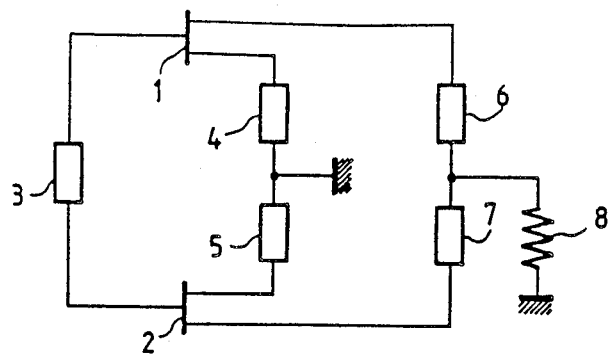
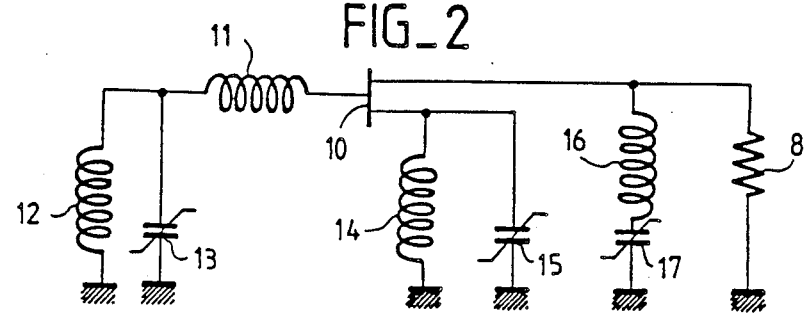
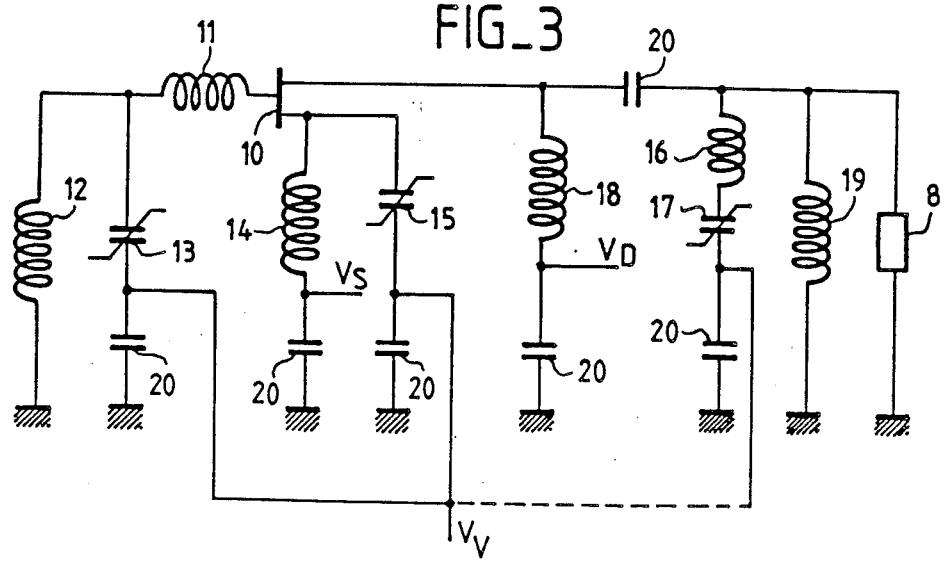

FREQUENCY-DOUBLING OSCILLATOR, TUNED BY VARACTORS

This invention relates to a frequency-doubling oscillator, operating in ultrahigh frequencies, and tuned by varactors. This oscillator comprises only one field-effect transistor, whose fundamental frequency is rejected by a filter which favors the production of the second harmonic.

Numerous types of ultrahigh-frequency oscillators are known, some of which are tuned by varactors and use one or more field-effect transistors and one or more variable-capacitance diodes. It is known to make oscillators controlled by varactors for which the maximum frequency to minimum frequency ratio is equal to approximately 2 up to 18 GHz, but limitations for climbing higher in frequency come from varactors, for which the chip surface, therefore the capacitance, cannot be reduced too much, otherwise, it is no longer possible to solder the connecting wire to these varactors. Further, the oscillators that can be made use the fundamental frequency of the transistor which oscillates, and double it.

In contrast, in the oscillator according to the invention, a single field-effect transistor is used, and if its gate and its source comprise circuits which are known in the art and which make it oscillate on a fundamental frequency, the drain comprises, according to the invention, a filter circuit which assures the rejection of the fundamental frequency and favors the emission of harmonics, in particular the second harmonic. Therefore the oscillator, tunable by varactors according to the invention, operates not by doubling the fundamental frequency, but, on the contrary, by attenuating it and favoring the generation of the second harmonic. The filter which serves for the rejection of the fundamental frequency also comprises a varactor.

More precisely, the invention relates to a frequency-doubling oscillator, operating in ultrahigh frequencies, comprising a field-effect transistor whose fundamental oscillation frequency is controlled by a gate impedance comprising at least one varactor by a source impedance comprising at least one varactor, this oscillator being characterized in that it comprises, between the drain of the transistor and the ground, an LC series type filter consisting of a self-induction coil and a varactor, this filter being tuned to the resonance with the fundamental frequency of the oscillator.

The invention will be better understood from the following more detailed description which rests on the accompanying figures which represent:

FIG. 1: simplified diagram of a doubling oscillator according to the prior art.

FIG. 2: simplified diagram of a doubling oscillator tunable by varactors according to the invention.

FIG. 3: detailed electric diagram of the doubling oscillator according to the invention.

FIG. 1 represents the very simplified diagram of a doubling oscillator of which numerous models are known. This doubling oscillator operates by means of two field-effect transistors 1 and 2, whose gate is joined by a common impedance 3, whose sources are joined together by two impedances 4 and 5, the point common to these two impedances being grounded. The drains of two transistors 1 and 2 deliver through two impedances 6 and 7, and the point common to these two impedances 6 and 7 supplies a current on a load 8 at a double frequency of the fundamental oscillation frequency of each of the two transistors 1 and 2. It is not necessary to go into detail on this diagram since it is already known. However, it requires a certain number of conditions hard to achieve, or which lead to drawbacks. The impedances which comprise, for example, a self-induction coil and a variable-capacitance diode called varactor should be identical to assure the symmetry of the oscillator, consequently, it is necessary that the varactors themselves be identical. Further, the field-effect transistors should be perfectly paired and have the same characteristics. Finally, the impedance of gate 3 is not positioned with respect to the ground, and its position with respect to the ground passes through the junctions of field-effect transistors 1 and 2 and through impedances 4 and 5: this can bring about interference in the frequency supplied by this oscillator.

Further, the varactors are diodes whose capacitance varies as a function of a reverse voltage which is applied to them, these diodes therefore have a certain chip surface, and it is not possible to vary the capacitance of a varactor in a ratio higher than approximately 10, i.e. for $C_{max}=1$ pF, $C_{min}=0.1$ pF, it cannot be pushed beyond that because such a varactor has a silicon table diameter on the order of 30 microns. Athough diodes are made which are in mesa structure, whose diameter is smaller than 30 microns, their capacitance would undoubtedly be smaller, but it would no longer be possible to solder the connecting wires by thermocompression on so small a table. That is why, in the domain of frequencies higher than 20 GHz, it is necessary to make doubling oscillators, since the existing varactors allow only oscillators of lower output frequency of approximately 20 GHz to be made.

The diagram in FIG. 2 is a simplified diagram of a frequency-doubling oscillator according to the invention.

It comprises only a single field-effect transistor 10, which already eliminates problems of pairing with other transistors.

Its gate circuit comprises, in a known way, a series 11 self-induction coil then a tuning circuit formed by a series 12 self-induction coil and a varactor 13 parallel with series 12 self-induction coil.

Its source circuit comprises, in a known way, a parallel self-induction coil 14 and a varactor 15. The polarizations of the transistor and the varactors are not put in this simplified diagram.

Suitably polarized and adjusted by means of varactors 13 and 15, transistor 10 operates as an oscillator and supplies a certain fundamental frequency, which is linked to the values of varactors 13 and 15.

But on its drain outlet, which delivers to a load 8, a filter circuit is mounted between the drain and the ground, and it is formed by a self-induction coil 16 in series with a varactor 17. This filter circuit is adjusted so that it assures the rejection of the fundamental frequency of the oscillating transistor, which thereby favors the emission of harmonics, and in particular the second harmonic. Consequently, load 8 receives a frequency which is double the fundamental frequency of transistor 10.

The role of the third varactor 17 is therefore:
to load the drain of the field-effect transistor by a short circuit obtained by the series resonance of self-induction coil 16 and varactor 17, the nonlinear operation of the field-effect transistor is therefore increased, the harmonic generation is therefore improved, to cancel the fundamental frequency on the level of the operating load.

The third varactor 17 intervenes only very little in the tuning band, and if the oscillator in its known part, in the left part of FIG. 2, is designed to have a wide tuning band, the oscillator according to the invention with circuit 16 and 17 also has a wide tuning band. Varactor 17 should be suited to the frequency law as a function of the voltage for the oscillator, and it does not have the same capacitance law as a function of the voltage as the varactors of gate 13 and source 15.

Concerning the tuning band, the presence of drain varactor 17 adds to the effect of negative resistance and modifies only very little the oscillation frequency, on the order of 100 to 200 MHz for an oscillation frequency on the order of 36 to 40 GHz.

The gate varactor 13 and source varactor 15 are preferably hyperabrupt type varactors having a capacitance ratio equal to 10, while drain varactor 17 is preferably an abrupt type varactor. The tuning band being an octave, it is necessary that the drain varactor have a capacitance ratio equal to 4, since the series resonance is given by $$F_r = \frac{1}{2\pi \sqrt{L_D C_{VD}}}$$

in which $F_r$ is the resonance frequency of filter 16+17

$L_D$ is the self-induction coil of drain 16

$C_{VD}$ is the capacitance of the drain varactor 17.

For this drain varactor 17, the more its quality factor is raised, the better the rejection of the fundamental mode. Further, the smaller the ratio of self-induction coil to filter circuit capacitance, the greater the width of the filter band. The limitation is produced by the achievable value of self-induction coil 16.

If the law of variation of the capacitance as a function of the voltage for drain varactor 17 does not correspond exactly to the law of variation of the frequency as a function of the voltage for the oscillator, a second LC network can be added parallel with the first, by tuning it to a slightly different frequency. It is a way to widen the filter band.

FIG. 3 gives the more detailed electric diagram of the doubling oscillator tunable by varactor according to the invention, the same symbols designating the same objects as in FIG. 2.

The polarization voltage of the VS source is applied between the self-induction coil of source 14 and a capacitance 20 which insulates it from the ground. Likewise, the polarization voltage of the VD drain is applied between a self-induction polarization coil 18 and a capacitance 20 which insulates it from the ground. The three varactors of gate 13 of source 15 and drain 17 are controlled by a voltage $V_v$, capacitance control of varactors, which is applied between each of these three varactors and a capacitance 20 which insulates it from the ground. Generally, users prefer to have only a single control voltage $V_v$ for controlling the three varactors, but it can happen that the control of the gate and the source are fixed and that there is need to vary the control of the drain vector 17. This is why the connection has been represented by a dotted line since there can optionally be two variation voltages of the varactors. All the decoupling or connecting capacities 20 are on the order of 10 pF.

Filter circuit 16+17 further exhibits an advantage: it insulates the oscillator from the outside which, if load 8 exhibits an impedance variation for whatever reasons, causes it not to influence the frequency of the oscillator, which remains stable.

The doubling oscillator tunable by three varactors as described operates in a band of 20 to 40 GHz, or in a domain higher than an octave and is satisfactory for the achievement of ultrahigh-frequency sources.

We claim:

1. A frequency-doubling oscillator, operating in ultrahigh frequencies, comprising:

a field-effect transistor;

a first varactor connected to the gate of said field-effect transistor, said first varactor controlling the fundamental oscillation frequency of said field-effect transistor;

a second varactor connected to the source of said field-effect transistor, said second varactor also controlling the fundamental oscillation frequency of said field-effect transistor;

an LC series filter comprised of a self-induction coil connected to a third varactor, said LC series filter being located between the drain of said field-effect transistor and ground, and wherein said LC series filter is tuned to reject the fundamental oscillation frequency of said field effect transistor.

2. A frequency-doubling oscillator according to claim 1, wherein:

said LC series filter is tuned to optimize the non-linear operation of said field-effect transistor and to favor the second harmonic of the fundamental frequency of said field-effect transistor.

3. A frequency-doubling oscillator according to claim 1, wherein:

said first varactor and said second varactor are of a hyperabrupt type and said third varactor is of an abrupt type.

4. A frequency-doubling oscillator according to claim 1, wherein:

the smaller the ratio of the inductance of said self-induction coil to the capacitance of said third varactor, the greater the band width of the LC series filter.

* * * * *